United States Patent
Wang et al.

(10) Patent No.: US 12,349,601 B2
(45) Date of Patent: Jul. 1, 2025

(54) SEMICONDUCTOR STRUCTURE AND METHOD FOR MANUFACTURING SAME, AND SEMICONDUCTOR MEMORY

(71) Applicants: CHANGXIN MEMORY TECHNOLOGIES, INC., Hefei (CN); BEIJING SUPERSTRING ACADEMY OF MEMORY TECHNOLOGY, BeiJing (CN)

(72) Inventors: Xiaoguang Wang, Hefei (CN); Huihui Li, Hefei (CN); Xianqin Hu, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 442 days.

(21) Appl. No.: 17/832,883

(22) Filed: Jun. 6, 2022

(65) Prior Publication Data
US 2023/0029195 A1     Jan. 26, 2023

Related U.S. Application Data

(63) Continuation of application No. PCT/CN2021/123606, filed on Oct. 13, 2021.

(30) Foreign Application Priority Data

Jul. 8, 2021    (CN) .......................... 202110772837.8

(51) Int. Cl.
*H01L 43/02*     (2006.01)
*H01L 27/22*     (2006.01)
(Continued)

(52) U.S. Cl.
CPC ............. *H10N 50/80* (2023.02); *H10B 61/00* (2023.02); *H10N 50/01* (2023.02)

(58) Field of Classification Search
CPC ......... H01L 21/76804; H01L 21/76822; H01L 21/76832; H10N 50/01; H10N 50/80; H10N 50/10; H10B 61/00; H10B 61/10
See application file for complete search history.

(56) References Cited

U.S. PATENT DOCUMENTS

| 9,013,045 B2 | 4/2015 | Satoh |
| 9,589,991 B2 | 3/2017 | Wang |

(Continued)

FOREIGN PATENT DOCUMENTS

| CN | 103811331 A | 5/2014 |
| CN | 104218094 A | 12/2014 |

(Continued)

OTHER PUBLICATIONS

K. Lee et al., "1Gbit High Density Embedded STT-MRAM in 28nm FDSOI Technology" 2019 IEEE International Electron Devices Meeting (IEDM), San Francisco, CA, USA, 2019, pp. 2.2.1-2.2.4, doi: 10.1109/IEDM19573.2019.8993551, 4 pages.

(Continued)

*Primary Examiner* — John A Bodnar
(74) *Attorney, Agent, or Firm* — Kilpatrick Townsend & Stockton LLP

(57) ABSTRACT

A semiconductor structure includes: a Magnetic Random Access Memory (MRAM) cell, including a bottom electrode, a Magnetic Tunnel Junction (MTJ) stack and a top electrode; an insulating layer covering a sidewall partially and a top surface of the MRAM cell; a first dielectric layer, a stop layer and a second dielectric layer sequentially stacked on the insulating layer; and a top electrode contact hole penetrating through the second dielectric layer, the stop (Continued)

layer, the first dielectric layer and the insulating layer, and extending to the top electrode, where the top electrode contact hole includes a first portion and a second portion connected with each other in the stop layer, and a radial width of the second portion in contact with the top electrode is gradually decreased with an increase in a depth of the top electrode contact hole. Method for manufacturing the structure and semiconductor memory are also provided.

9 Claims, 15 Drawing Sheets

(51) Int. Cl.
*H01L 43/12* (2006.01)
*H10B 61/00* (2023.01)
*H10N 50/01* (2023.01)
*H10N 50/80* (2023.01)

(56) References Cited

U.S. PATENT DOCUMENTS

| | | | |
|---|---|---|---|
| 9,893,120 | B2 | 2/2018 | Chuang |
| 10,304,903 | B2 | 5/2019 | Chuang |
| 10,312,434 | B2 | 6/2019 | Briggs |
| 10,347,825 | B2 | 7/2019 | Briggs |
| 10,411,068 | B2 | 9/2019 | Wiegand |
| 10,727,274 | B2 | 7/2020 | Chen |
| 10,727,397 | B1 | 7/2020 | Wang |
| 10,790,439 | B2 | 9/2020 | Ku |
| 10,991,758 | B2 | 4/2021 | Chuang |
| 11,189,658 | B2 | 11/2021 | Wei et al. |
| 11,189,659 | B2 | 11/2021 | Chuang |
| 2015/0364420 | A1 | 12/2015 | Lin et al. |
| 2016/0254287 | A1 | 9/2016 | Wang et al. |
| 2017/0301728 | A1 | 10/2017 | Chuang et al. |
| 2018/0158869 | A1 | 6/2018 | Chuang et al. |
| 2018/0240968 | A1 | 8/2018 | Briggs et al. |
| 2018/0240971 | A1 | 8/2018 | Briggs et al. |
| 2019/0027536 | A1 | 1/2019 | Wiegand et al. |
| 2019/0273118 | A1 | 9/2019 | Chuang et al. |
| 2020/0035908 | A1* | 1/2020 | Ku .................... H01F 41/34 |
| 2020/0075669 | A1 | 3/2020 | Chuang et al. |
| 2020/0127047 | A1 | 4/2020 | Chen et al. |
| 2020/0144484 | A1 | 5/2020 | Chen et al. |
| 2020/0227625 | A1 | 7/2020 | Wang et al. |
| 2020/0350365 | A1 | 11/2020 | Chen et al. |
| 2020/0350366 | A1 | 11/2020 | Chen et al. |
| 2020/0403146 | A1 | 12/2020 | Ku et al. |
| 2021/0028350 | A1 | 1/2021 | Ku et al. |
| 2021/0391384 | A1 | 12/2021 | Cho et al. |

FOREIGN PATENT DOCUMENTS

| | | |
|---|---|---|
| CN | 107302051 A | 10/2017 |
| CN | 108140724 A | 6/2018 |
| CN | 108417628 A | 8/2018 |
| CN | 110010759 A | 7/2019 |
| CN | 110783451 A | 2/2020 |
| CN | 110875352 A | 3/2020 |
| CN | 111092066 A | 5/2020 |
| CN | 111435702 A | 7/2020 |
| CN | 111613572 A | 9/2020 |

OTHER PUBLICATIONS

United States Patent and Trademark office, Non-Final office action issued in related U.S. Appl. No. 17/807,016 on Sep. 24, 2024.

* cited by examiner

SEMICONDUCTOR STRUCTURE AND METHOD FOR MANUFACTURING SAME, AND SEMICONDUCTOR MEMORY

CROSS-REFERENCE TO RELATED APPLICATIONS

This is a continuation application of International Patent Application No. PCT/CN2021/123606, filed on Oct. 13, 2021, which claims priority to Chinese Patent Application No. 202110772837.8, filed on Jul. 8, 2021 and entitled "SEMICONDUCTOR STRUCTURE AND METHOD FOR MANUFACTURING SAME, AND SEMICONDUCTOR MEMORY". The disclosures of International Patent Application No. PCT/CN2021/123606 and Chinese Patent Application No. 202110772837.8 are incorporated by reference herein in their entireties.

BACKGROUND

A Magnetic Random Access Memory (MRAM) using a Magnetic Tunnel Junction (MTJ) is a solid-state nonvolatile memory, and has the advantages of high-speed reading and writing, large capacity, and low energy consumption.

However, the MTJ in the related art has the problems of poor performance and metal pollution.

SUMMARY

Embodiments of the disclosure relate to the technical field of semiconductors.

In order to solve the related technical problems, embodiments of the disclosure provide a semiconductor structure and a method for manufacturing the same, and a semiconductor memory.

According to a first aspect of the embodiments of the disclosure, there is provided a semiconductor structure, including:
 an MRAM cell, the MRAM cell including a bottom electrode, an MTJ stack, and a top electrode;
 an insulating layer covering a sidewall partially and a top surface of the MRAM cell;
 a first dielectric layer, a stop layer, and a second dielectric layer sequentially stacked on the insulating layer; and
 a top electrode contact hole penetrating through the second dielectric layer, the stop layer, the first dielectric layer and the insulating layer, and extending to the top electrode, where the top electrode contact hole includes a first portion and a second portion connected with each other in the stop layer, and a radial width of the second portion in contact with the top electrode is gradually decreased with an increase in a depth of the top electrode contact hole.

According to a second aspect of the embodiments of the disclosure, there is further provided a semiconductor memory, including the semiconductor structure provided by the embodiments of the disclosure.

According to third second aspect of the embodiments of the disclosure, there is further provided a method for manufacturing a semiconductor structure, including:
 providing an MRAM cell and an insulating layer, where the MRAM cell includes a bottom electrode, an MTJ stack, and a top electrode, and the insulating layer covers a top surface and a sidewall of the MRAM cell;
 sequentially forming and stacking a first dielectric layer, a stop layer, and a second dielectric layer on the insulating layer;
 performing a first etching on the second dielectric layer to form a first portion of a top electrode contact hole penetrating through the second dielectric layer and extending to the stop layer; and
 performing a second etching on the first dielectric layer and the insulating layer to form a second portion of the top electrode contact hole penetrating through the first dielectric layer and the insulating layer, extending to the top electrode, and deepening the first portion, where a radial width of the second portion is gradually decreased with an increase in a depth of the top electrode contact hole.

DESCRIPTION OF REFERENCE NUMERALS

Figure 1:
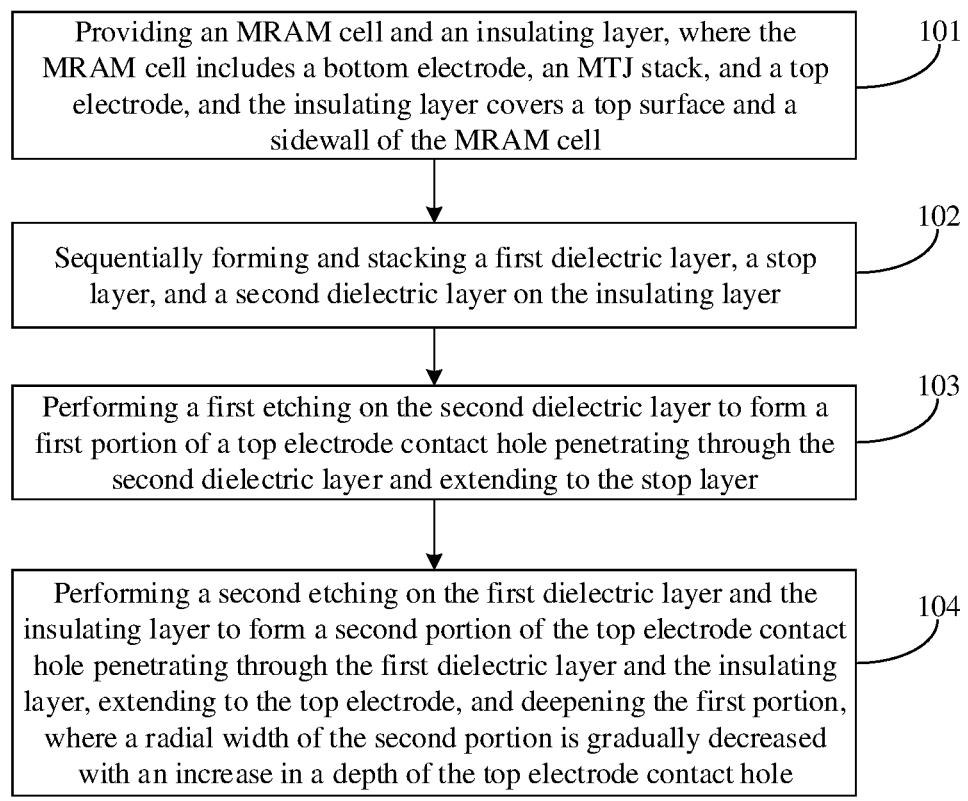
FIG. 1 is a schematic diagram of implementation process of a method for manufacturing a semiconductor structure provided by an embodiment of the disclosure.

301—MRAM cell; 3011—bottom electrode; 3012—MTJ stack; 3013—top electrode; 302—insulating layer; 303—first dielectric layer; 303'—dielectric material; 304—stop layer; 305—second dielectric layer; 306—top electrode contact hole; 3061—first portion of top electrode contact hole; 3062—second portion of top electrode contact hole; 307'—conductive material; 307—top electrode contact plug.

DETAILED DESCRIPTION

Exemplary implementations of the disclosure are described below in more detail with reference to the accompanying drawings. Although the exemplary implementations in the embodiments of the disclosure are shown in the accompanying drawings, it should be understood that the embodiments of the disclosure can be implemented in various forms without being limited the specific implementations described herein. Instead, these implementations are provided in order to provide a more thorough understanding of the embodiments of the disclosure and to completely convey the scope of the embodiments of the disclosure to persons skilled in the art.

In the following description, a large number of specific details are given to provide a more thorough understanding of the embodiments of the disclosure. However, it is apparent for persons skilled in the art that the disclosure can be implemented without one or more of these details. In other examples, in order to avoid confusion with the disclosure, some well-known technical features in the art are not described. That is, not all features of actual embodiments are described herein, and well-known functions and structures are not described in detail.

In the accompanying drawings, for clarity, the dimensions of layers, regions, and elements, and relative dimensions thereof may be exaggerated. The same reference numerals in the full text represent the same elements.

It should be understood that the spatial relationship terms "beneath", "below", "lower", "under", "above", "upper", and the like may be used herein for convenience of description, so as to describe a relationship between one element or feature and another element or feature shown in the figures. It should be understood that in addition to orientations shown in the figures, the spatial relationship terms are intended to further include different orientations of devices in use and operation. For example, if the device in the accompanying drawings is turned over, the elements or features described as "below", "under" or "beneath" other elements or features would then be oriented "above" the other elements or features. Therefore, the exemplary terms "below" and "beneath" may include two orientations: up and down. The device may be otherwise oriented (rotated by 90 degrees or at other orientations), and the spatial descriptors used herein are accordingly interpreted.

The terms used herein are intended to only describe specific embodiments and do not impose a limitation on the embodiments of the disclosure. As used herein, the singular forms "a", "one", and "the/said" are also intended to include the plural forms, unless the context clearly indicates otherwise. It should be further understood that the terms "constitute" and/or "include", when used in the description, determine the presence of the stated features, integers, steps, operations, elements, and/or components, but do not preclude the presence or addition of one or more other features, integers, steps, operations, elements, components, and/or groups. As used herein, the term "and/or" includes any and all combinations of the associated listed items.

To understand the features and technical content of the embodiments of the disclosure in more detail, the following describes implementations of the embodiments of the disclosure in detail with reference to the accompanying drawings. The accompanying drawings are intended for reference only, and not intended to limit the embodiments of this disclosure.

An MRAM includes a plurality of MRAM cells. Each MRAM cell (also referred to as an MTJ post) includes a Bottom Electrode (BE), an MTJ stack, and a Top Electrode (TE). The MTJ stack generally is a sandwich structure and may include a memory layer, a barrier layer, and a reference layer.

In practical application, a bit line of the magnetic random access memory is electrically connected to the MTJ stack of the MRAM through a top electrode contact plug and the top electrode. Moreover, in order to improve the reliability of the electrical connection, a bottom dimension of a top electrode contact hole is greater than a top dimension of the MTJ post.

In related art, a method for forming top electrode contact of the MRAM includes: directly forming the top electrode contact hole on the MTJ post, and then depositing a metal in the top electrode contact hole to form the top electrode contact plug.

The controllability of the landing of the top electrode contact hole on the MTJ post is vital for the quality of the MRAM cell. In the related art, using the mode of directly forming the top electrode contact hole on the MTJ post has a risk of over-etching. This over-etching causes the top electrode contact hole to be recessed into a packaging layer of the MTJ post, and in this case, this would cause the problems of poor MTJ performance and metal pollution. Since the controllability of the landing of the top electrode contact hole on the MTJ post is vital for the quality of a formed MRAM cell, the accurate landing of the top electrode contact hole on the MTJ post is a challenge in the manufacturing of the magnetic random access memory.

In other words, in the related art, when the top electrode contact hole is landed on the MTJ post, there are problems of poor controllability and poor uniformity; moreover, there is a problem that the top electrode contact hole is not matched with the key dimension of the MTJ post.

For this purpose, the following technical solution of the embodiments of the disclosure is provided.

The embodiments of the disclosure provide a method for manufacturing a semiconductor. FIG. 1 is a schematic implementation process diagram of a method for manufacturing a semiconductor structure provided by an embodiment of the disclosure. As shown in FIG. 1, the method include the following operations:

Operation 101, an MRAM cell and an insulating layer are provided. The MRAM cell includes a bottom electrode, an MTJ stack, and a top electrode, and the insulating layer covers a top surface and a sidewall of the MRAM cell.

Operation 102, a first dielectric layer, a stop layer, and a second dielectric layer are sequentially formed and stacked on the insulating layer.

Operation 103, a first etching on the second dielectric layer is performed to form a first portion of a top electrode contact hole penetrating through the second dielectric layer and extending to the stop layer.

Operation 104, a second etching on the first dielectric layer and the insulating layer is performed to form a second portion of the top electrode contact hole penetrating through the first dielectric layer and the insulating layer, extending to the top electrode, and deepening the first portion, where a radial width of the second portion is gradually decreased with an increase in a depth of the top electrode contact hole.

FIG. 2A to FIG. 2H are schematic diagrams of implementation process of a method for manufacturing a semiconductor structure provided by an embodiment of the disclosure. The implementation process of the method for manufacturing the semiconductor structure of the embodiment of the disclosure is described below with reference to FIG. 2A to FIG. 2H.

Figure 2A:
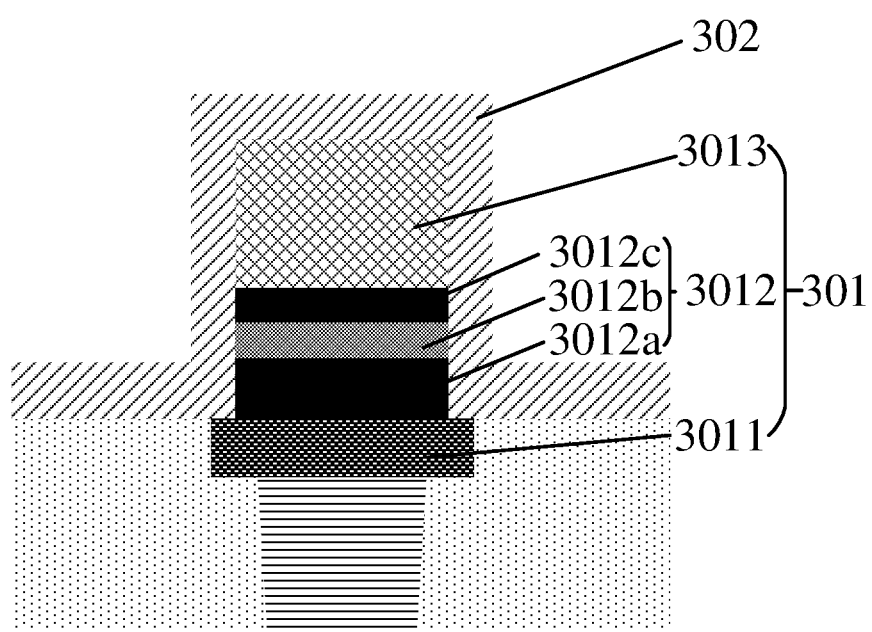
FIG. 2A to FIG. 2H are schematic diagrams of implementation process of a method for manufacturing a semiconductor structure provided by an embodiment of the disclosure.

In operation 101, as shown in FIG. 2A, the MRAM cell 301 includes the bottom electrode 3011, the MTJ stack 3012, and the top electrode 3013, and the insulating layer 302 covers the top surface and the sidewall of the MRAM cell 301.

In practical application, a material for forming the bottom electrode 3011 is a conductive material, and specifically can include, but is not limited to, one or more of tantalum (Ta), tantalum nitride (TaN), titanium (Ti), titanium nitride (TiN), tungsten (W), tungsten nitride (WN), and ruthenium (Ru). A thickness range of the bottom electrode 3011 can be 5-80 nm.

In practical application, the MTJ stack 3012 can include the reference layer 3012a, the barrier layer 3012b, and the memory layer 3012c. A magnetization direction of the reference layer 3012a is unchanged, and the reference layer can generally include an in-plane (iSTT-MRAM) or vertical (pSTT-MRAM) structure. An in-plane reference layer can be made of a material including IrMn or PtMn/CoFe/Ru/CoFe/CoFeB, and can have a thickness range of 10-30 nm. A vertical reference layer generally has a TbCoFe or [Co/Pt]/Co/Ru/[CoPt]/CoFeBm superlattice multilayer film structure, and a lower seed layer, such as Ta/Pt, is generally needed. The thickness range of the reference layer can be 5-20 nm. The barrier layer 3012b is located between the magnetic memory layer and the magnetic reference layer, and has an insulating function. A material for forming the barrier layer can include a nonmagnetic metal oxide, such as magnesium oxide (MgO) or aluminum oxide ($Al_2O_3$). A thickness range of the barrier layer can be 0.5-3 nm. The memory layer 3012c is used for changing the magnetization direction so as to record different data, and can generally include an in-plane (iSTT-MRAM) or vertical (pSTT-MRAM) structure. An in-plane memory layer can be made of a material including CoFe/CoFeB or CoFe/NiFe, and can have a thickness range of 2-6 nm. A vertical memory layer can be made of a material including CoFeB, CoFe/CoFeB, Fe/CoFeB, and CoFeB(Ta, W, Mo)/CoFeB, and can have a thickness range of 0.8-2 nm. It should be noted that the upper and lower positions of the memory layer 3012c and the reference layer 3012a with respect to each other may be interchanged.

In practical application, a material for forming the top electrode 3013 is a conductive material, and specifically can include, but is not limited to, one or more of tantalum (Ta), tantalum nitride (TaN), titanium (Ti), titanium nitride (TiN), tungsten (W), and tungsten nitride (WN). A thickness range of the top electrode 3013 can be 20-100 nm.

In practical application, a material for forming the insulating layer 302 can include silicon oxide ($SiO_x$), silicon oxynitride (SiON), silicon carbide (SiC), silicon nitride (SiN), or silicon carbonitride (SiCN), etc.

In practical application and in some embodiments, a method for forming the MRAM cell 301 and the insulating layer 302 includes: sequentially depositing a bottom electrode material layer, a multilayer magnetic tunnel junction material layer, and a top electrode material layer; patterning and defining a pattern of the multilayer magnetic tunnel junction material layer, and etching the top electrode material layer, the multilayer magnetic tunnel junction material layer, and the bottom electrode material layer to form the bottom electrode 3011, the MTJ stack 3012, and the top electrode 3013; and depositing the insulating layer 302 on the top surface and at least part of the sidewall of the MRAM cell 301.

In practical application, a process such as Chemical Vapor Deposition (CVD), Physical Vapor Deposition (PVD), Atomic Layer Deposition (ALD), or Ion Beam Deposition (IBE), can be used when depositing the bottom electrode material layer, the multilayer magnetic tunnel junction material layer, the top electrode material layer, and the insulating layer. A Reactive Ion Etching (RIE) process and/or an Ion Beam Etching (IBE) process can be used when etching the bottom electrode material layer, the multilayer magnetic tunnel junction material layer, and the top electrode material layer. In some specific implementations, when the top electrode is etched by using the RIE process, an etching process can be executed by using an etching gas, such as $Cl_2$ or $CF_4$. When the magnetic tunnel junction stack and the bottom electrode are etched by using the RIE process, an etching process can be executed by using an etching gas, such as $CH_3OH$, $CH_4/Ar$, $C_2H_5OH$, $CH_3OH/Ar$, or $CO/NH_3$.

Figure 2B:
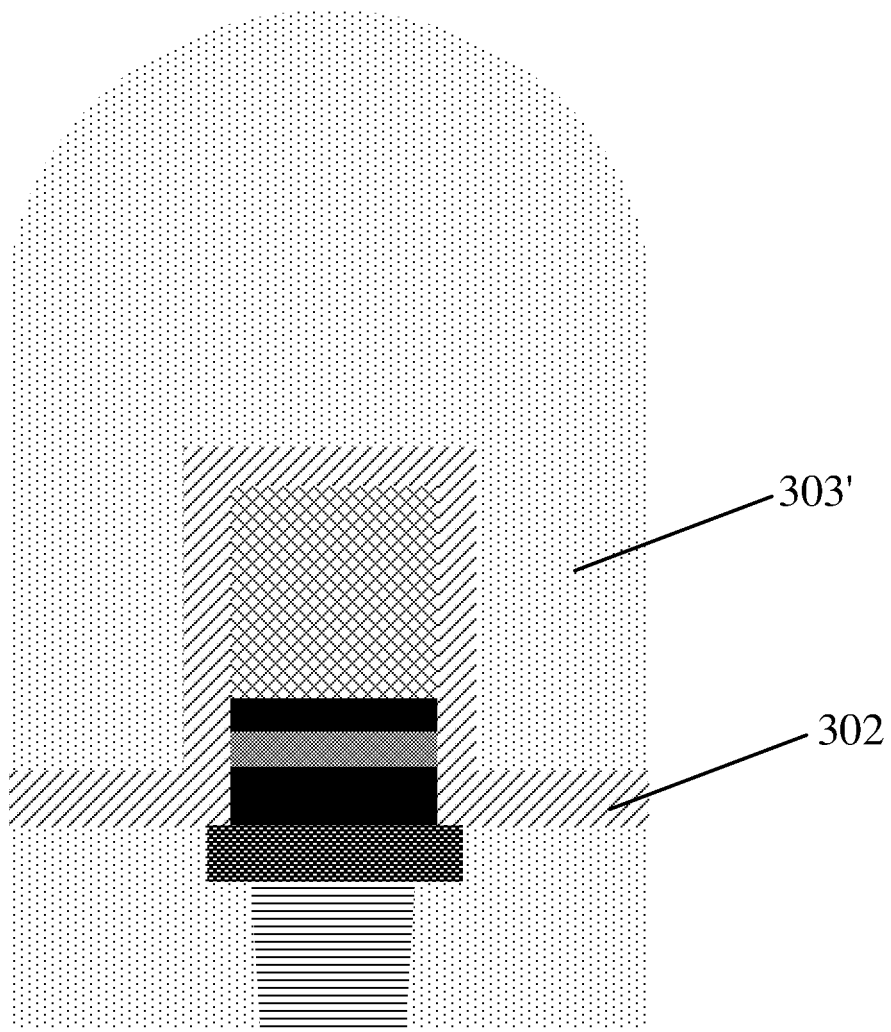
Figure 2C:
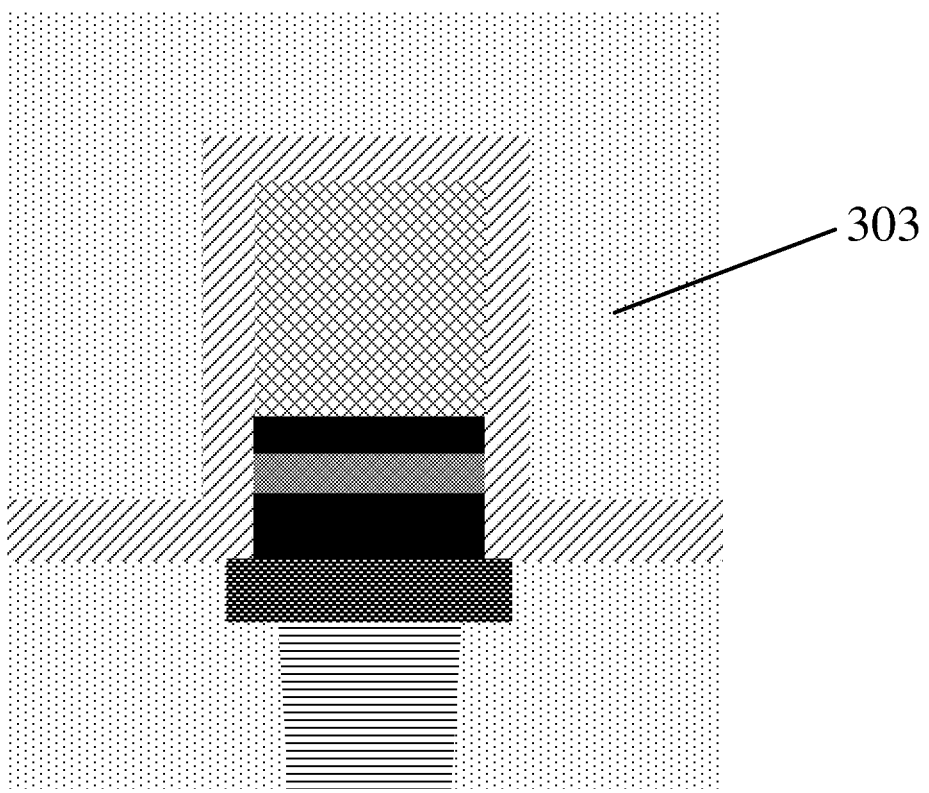
Figure 2D:
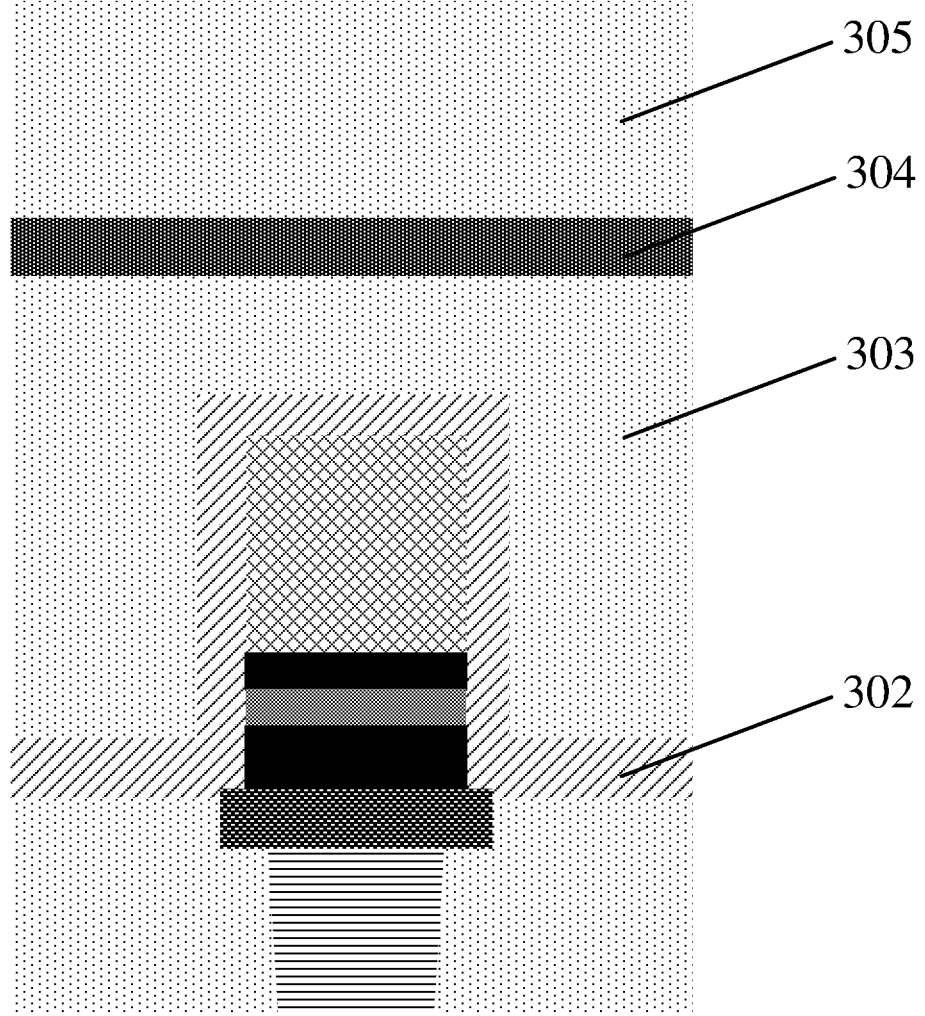

In operation 102, as shown in FIG. 2B to FIG. 2D, the first dielectric layer 303, the stop layer 304, and the second dielectric layer 305 are sequentially formed and stacked on the insulating layer 302.

In practical application, a material for forming the first dielectric layer 303 and a material for forming the second dielectric layer 305 can be identical or different. The material for forming the first dielectric layer 303 and the material for forming the second dielectric layer 305 specifically can include silicon oxide, silicon nitride, silicon carbide, silicon oxynitride, or other low-k dielectric materials.

The stop layer 304 is used as an etch stop layer for the second dielectric layer 305, and based on this, a material for forming the stop layer 304 is different from the material for forming the second dielectric layer 305. The material for forming the stop layer specifically can include silicon nitride, silicon oxide, silicon carbide, or silicon oxynitride. It should be noted that the material for forming the stop layer 304 and the material for forming the first dielectric layer 303 can be identical or different. When the material for forming the stop layer 304 can be the same as the material for forming the first dielectric layer 303, the stop layer can serve as a part of the first dielectric layer.

It can be understood that when the material for forming the first dielectric layer is different from the material for forming the second dielectric layer and the second dielectric layer can serve as the etch stop layer for the first dielectric layer, the stop layer 304 can be omitted herein. Of course, a plurality of stop layers 304 can also be included. The material for forming the stop layer 304 determines whether the sidewall of a portion of the top electrode contact hole corresponding to the stop layer 304 has a morphology having a gradient change. In the embodiments of the disclosure, there is no limitation on whether the sidewall of the portion of the top electrode contact hole corresponding to the stop layer 304 has the morphology having the gradient change.

In some embodiments, the operation of forming the first dielectric layer 303 on the insulating layer 302 includes: depositing a dielectric material 303' (as shown in FIG. 2B) on the insulating layer 302; and performing a planarization processing on the dielectric material 303' to form the first dielectric layer 303 (as shown in FIG. 2C).

Next, as shown in FIG. 2D, the stop layer 304 covering the first dielectric layer 303 is deposited on a top surface of the first dielectric layer 303, and the second dielectric layer 305 covering the stop layer 304 is deposited on a top surface of the stop layer 304.

In practical application, the manner for depositing the dielectric material 303', the stop layer 304, and the second dielectric layer 305 includes, but is not limited to, the CVD, PVD, or ALD process. The manner for performing the planarization processing on the dielectric material 303' includes, but is not limited to, Chemical Mechanical Polishing (CMP).

Figure 2E:
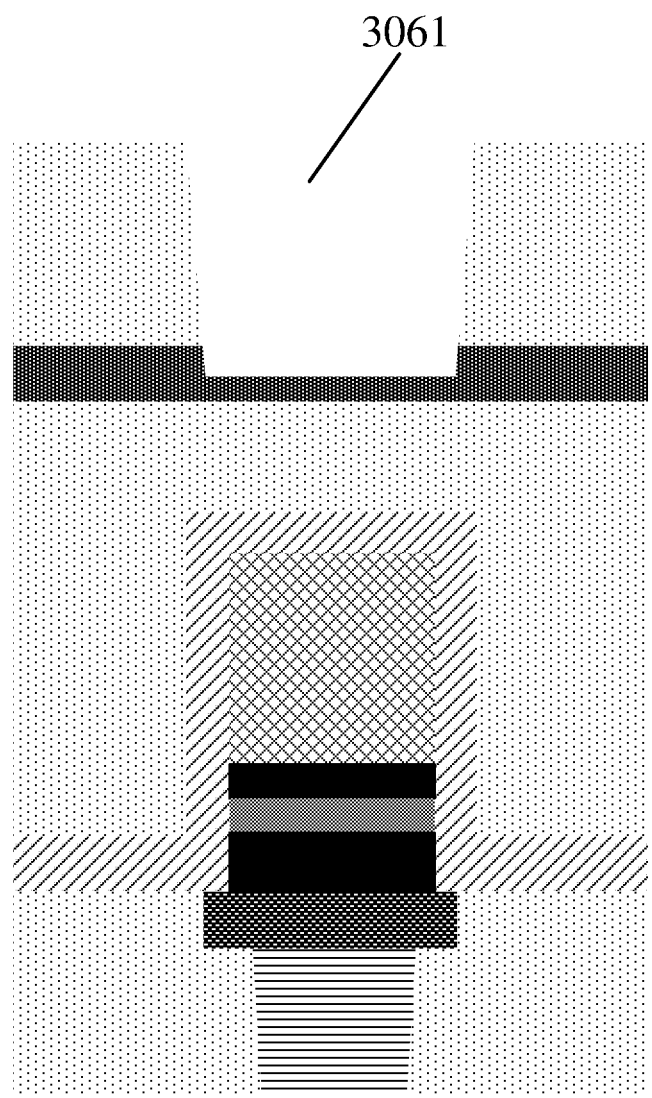

In operation 103, as shown in FIG. 2E, a first etching is performed on the second dielectric layer 305 to form the first portion 3061 of the top electrode contact hole penetrating through the second dielectric layer 305 and extending to the stop layer 304.

In practical application, the operation of performing the first etching includes: performing the first etching by using a dry etching process. The dry etching process is executed by using a fluorine source-containing etching gas, and more specifically, a fluorine source in the etching gas is used to execute etching. In some embodiments, the dry etching specifically can be plasma etching, and the etching gas can be $CF_4$, $CHF_3$, or other etching gases that are well-known in the art and can be used for etching the second dielectric layer 305.

It should be noted that in theory, when the first etching is performed on the second dielectric layer 305, the first etching is just stopped between the second dielectric layer 305 and the stop layer 304. However, in practical application, the first etching may be stopped in the middle of the stop layer 304. It can be understood that the purpose of introducing the stop layer in the embodiments of the disclosure is to first perform the control of first step when etching the top electrode contact hole. The control can be performed in a point-to-point manner to improve etching uniformity, thereby enlarging the process window for the landing of the top electrode contact hole; moreover, the control can have the functions of improving the alignment precision of a landing position and preventing over-etching when performing subsequent second etching on the top electrode contact hole.

On this basis, no matter whether the first etching is stopped between the second dielectric layer 305 and the stop layer 304, or in the middle of the stop layer 304, the above functions can be achieved. Therefore, the described two stopping manners of the first etching both fall within the scope of protection of the embodiments of the disclosure.

Figure 2F:
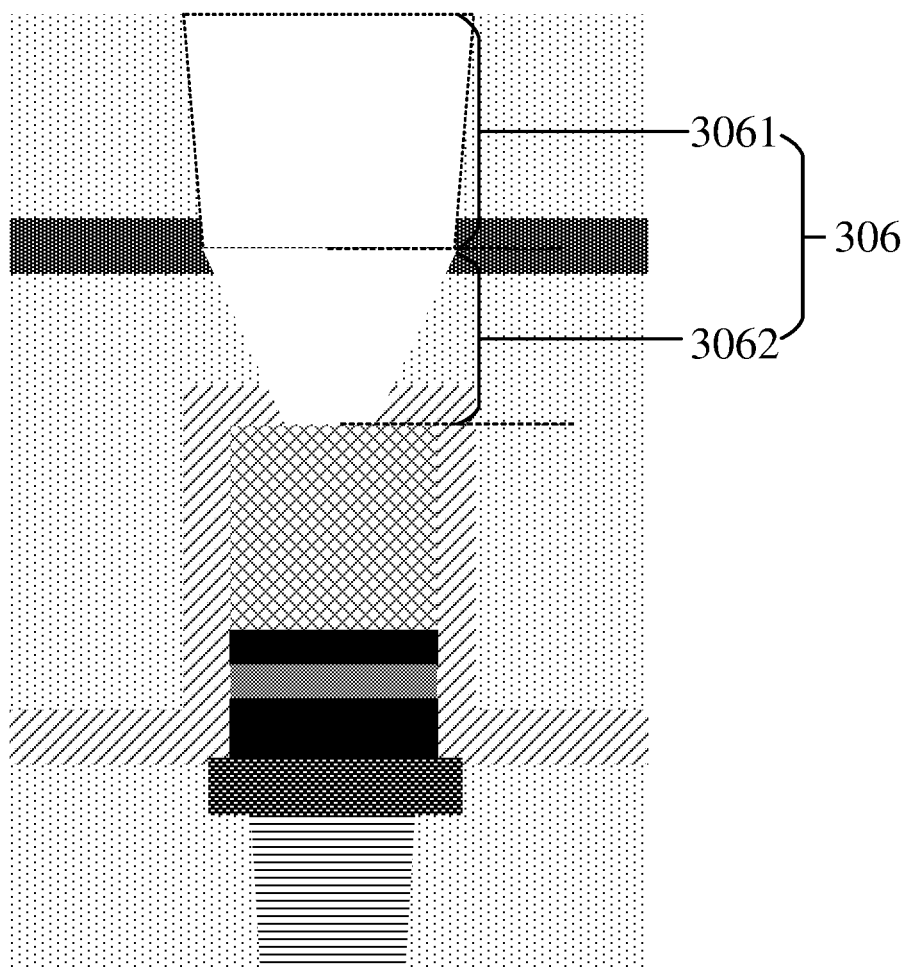

In operation 104, as shown in FIG. 2F, a second etching is performed on the first dielectric layer 303 and the insulating layer 302 to form the second portion 3062 of the top electrode contact hole 306 penetrating through the first dielectric layer 303 and the insulating layer 302 and extending to the top electrode 3013. The second portion 3062 further deepens the first portion 3061, i.e., the first portion 3061 and the second portion 3062 together constitute the top electrode contact hole 306, and the first portion 3061 and the second portion 3062 are connected at a stop position of the first etching.

Herein, the radial width can be understood to be an opening dimension of a hole or a trench along a direction perpendicular to a depth direction of the hole or the trench. The expression that the radial width of the second portion 3062 is gradually decreased with the increase in the depth of the top electrode contact hole 306 can be understood to be that a sidewall of the second portion 3062 exhibits a marked gradient change (as shown in FIG. 2F) with the increase in the depth of the top electrode contact hole 306.

It should be noted that in practical application, when performing the second etching, a dimension of a top opening is slightly less than a dimension of a bottom opening due to the etching process itself, which does not belong to the case that the radial width of the second portion 3062 is gradually decreased with the increase in the depth of the top electrode contact hole 306.

It can be understood that the second portion 3062 is set to have the morphology having the gradient change, so that the radial width of the top electrode contact plug 307 subsequently filled in the top electrode contact hole 306 at a contact position with the top electrode 3013 can be relatively small in dimension, and the remaining portions of the plug are relatively large in dimension. In this way, the problem of critical dimension mismatch between the top electrode contact hole and the MTJ post can be solved under the premise of ensuring the reliability of an electrical connection.

Moreover, when a radial width of the first portion 3061 is greater than a radial width of the top electrode 3013, the top electrode contact plug having the radial width greater than the radial width of the MTJ post can be easily implemented, and therefore, the dimensional tolerance of the top electrode contact plug can be improved.

Figure 2G:
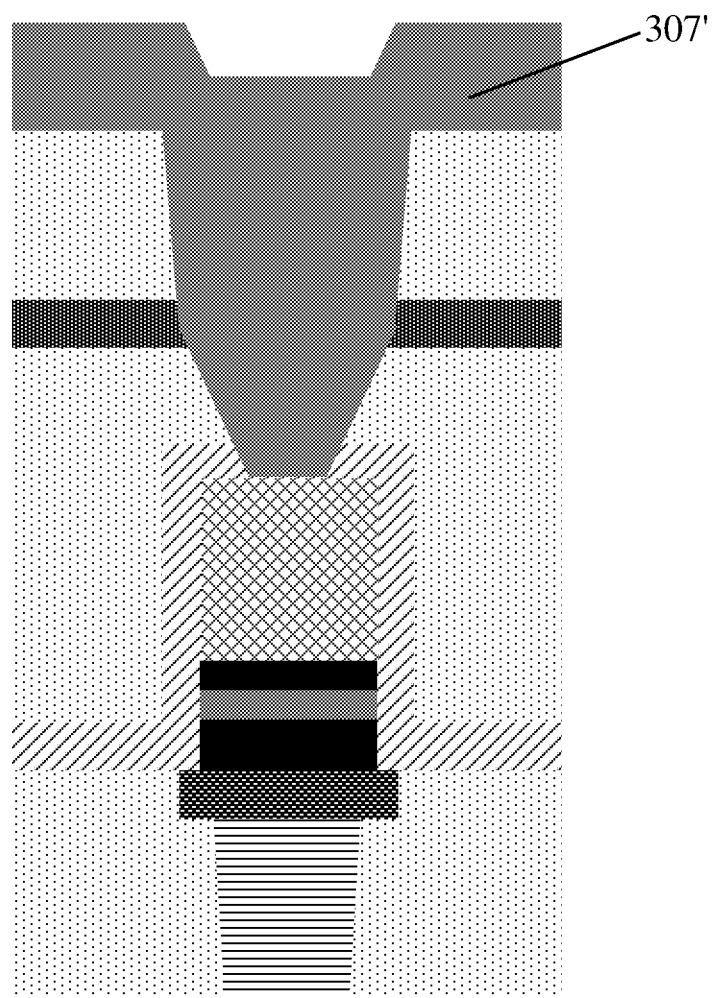
Figure 3:
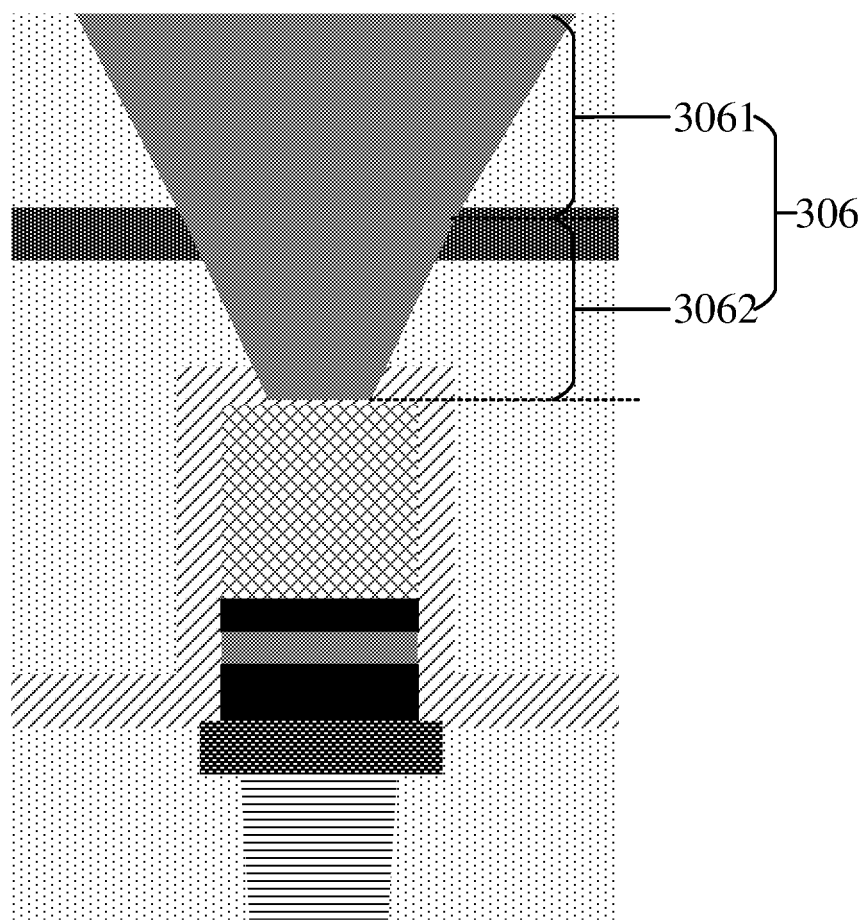
FIG. 3 is a schematic sectional view of another semiconductor structure provided by an embodiment of the disclosure.

In practical application, the radial width of the first portion 3061 can be gradually decreased with the increase in the depth of the top electrode contact hole 306 (as shown in FIG. 3); or the radial width of the first portion 3061 can remain unchanged with the increase in the depth of the top electrode contact hole 306 (as shown in FIG. 2G).

It should be noted that as shown in FIG. 2G, a case that the radial width of the first portion 3061 can remain unchanged with the increase in the depth of the top electrode contact hole 306 neglects the case that in practical application, when performing the first etching, the dimension of the top opening is slightly less than the dimension of the bottom opening due to the etching process itself. That is, the case that the dimension of the top opening is slightly less than the dimension of the bottom opening due to the etching process itself belongs to the case of remaining unchanged with the increase in the depth of the top electrode contact hole 306 described in the embodiments of the disclosure.

In practical application, forming the first portion 3061 having a tapering sidewall and/or the second portion 3062 having a tapering sidewall can be implemented by forming the dielectric layer having a gradient change characteristic and/or adjusting an etching rate or etch selectivity of the dielectric layer.

Specifically, in some embodiments, forming the first dielectric layer 303 includes forming, by using a deposition parameter having a gradient change over time, the first dielectric layer 303 with a characteristic parameter having a gradient change along a depth direction of the top electrode contact hole; and/or, performing the second etching on the first dielectric layer 303 and the insulating layer 302 includes performing the second etching on the first dielectric layer 303 and the insulating layer 302 by using an etching parameter having a gradient change over time.

In some embodiments, the radial width of the first portion 3061 is gradually decreased with the increase in the depth of the top electrode contact hole 306.

Forming the second dielectric layer 305 includes forming, by using the deposition parameter having the gradient change over time, the second dielectric layer 305 with a characteristic parameter having the gradient change along the depth direction of the top electrode contact hole; and/or, performing the first etching on the second dielectric layer 305 includes performing the first etching on the second dielectric layer 305 by using an etching parameter having a gradient change over time.

That is, in practical application, the morphology of a tapering sidewall at least can be obtained by means of the following three manners.

First Manner:

In the case of forming a corresponding dielectric layer to be etched (broadly referring to the first dielectric layer or the second dielectric layer), the deposition parameter having the gradient change over time is used to form the dielectric layer having the characteristic parameter having the gradient change along the depth direction of the top electrode contact hole. When etching the dielectric layer to be etched, a conventional etching condition is used for etching (i.e., a certain etching parameter is not intentionally set to have a gradient change over time). When performing etching along the depth direction of the top electrode contact hole, the etching rate or the etch selectivity ratio has a gradient change along the depth direction of the top electrode contact hole because the characteristic parameter of the dielectric layer itself has a gradient change along the depth direction of the top electrode contact hole. It can be understood that, the etching rate or the etch selectivity ratio can be gradually decreased along the depth direction of the top electrode contact hole by means of reasonable control, so that the dimension of the opening along the depth direction of the top electrode contact hole is gradually decreased.

Herein, the deposition parameter at least includes at least one of a proportion of a chemical component of a reaction gas, pressure, temperature, or frequency, or is another deposition parameter capable of changing the characteristic parameter of the dielectric layer.

Herein, the characteristic parameter at least includes at least one of a proportion of a chemical component of the dielectric layer, stress, or rigidity, or is another characteristic parameter capable of changing the etching rate or the etch selectivity ratio when applying the same etching parameter to the dielectric layer. In one specific embodiment, the proportion of the chemical component herein can be C/N in SiCN, O/N in SiON, O/C in SiOC, and the like.

It should be noted that in the case of forming the dielectric layer with the characteristic parameter having the gradient change, the dielectric layer only can be formed for a portion that needs to be etched, while the dielectric layer with the characteristic parameter having the gradient change does not need to be formed for a portion that does not need to be etched. For example, for the first dielectric layer 303, the dielectric layer with the characteristic parameter having the gradient change may be formed only for a portion of the first dielectric layer surrounding the second portion 3062 of the top electrode contact hole 306, while the dielectric layer with the characteristic parameter having the gradient change may not be formed for the remaining portion of the first dielectric layer. Of course, the dielectric layer with the characteristic parameter having the gradient change may also be formed for the remaining portion of the first dielectric layer.

In practical application, in the case of forming the dielectric layer to be etched, a consecutive dielectric layer or a dielectric layer having a plurality of stacked sub-dielectric layers can be formed.

In some embodiments, forming the first dielectric layer 303/the second dielectric layer 305 includes the following operations.

The first dielectric layers 303/second dielectric layers 305 which is consecutive is formed, where a characteristic parameter of the first dielectric layers 303/second dielectric layers 305 which is consecutive has a gradient change along the depth direction of the top electrode contact hole 306.

Or, the first dielectric layer 303/the second dielectric layer 305 having a plurality of stacked sub-dielectric layers is formed, where a characteristic parameter of the plurality of stacked sub-dielectric layers has a gradient change along the depth direction of the top electrode contact hole 306.

Figure 4A:
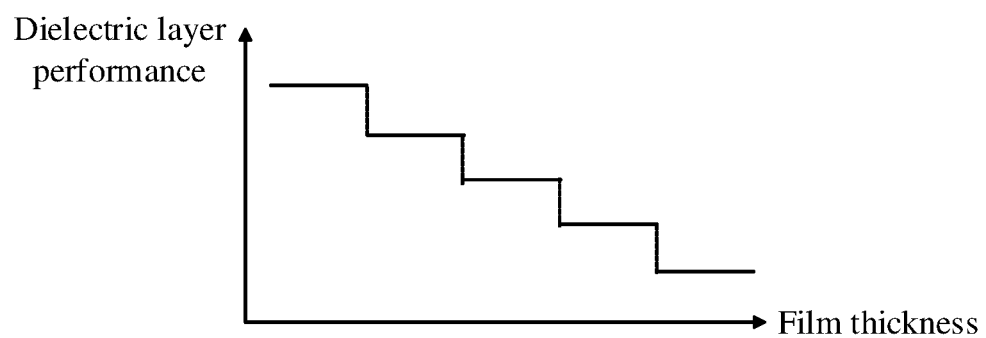
FIG. 4A is a schematic diagram illustrating the gradual decreasing of performance of a plurality of stacked sub-dielectric layers with film thickness provided by an embodiment of the disclosure.
Figure 4B:
FIG. 4B is a schematic diagram of the performance gradient change of each sub-dielectric layer of a plurality of stacked sub-dielectric layers provided by an embodiment of the disclosure.
Figure 4C:
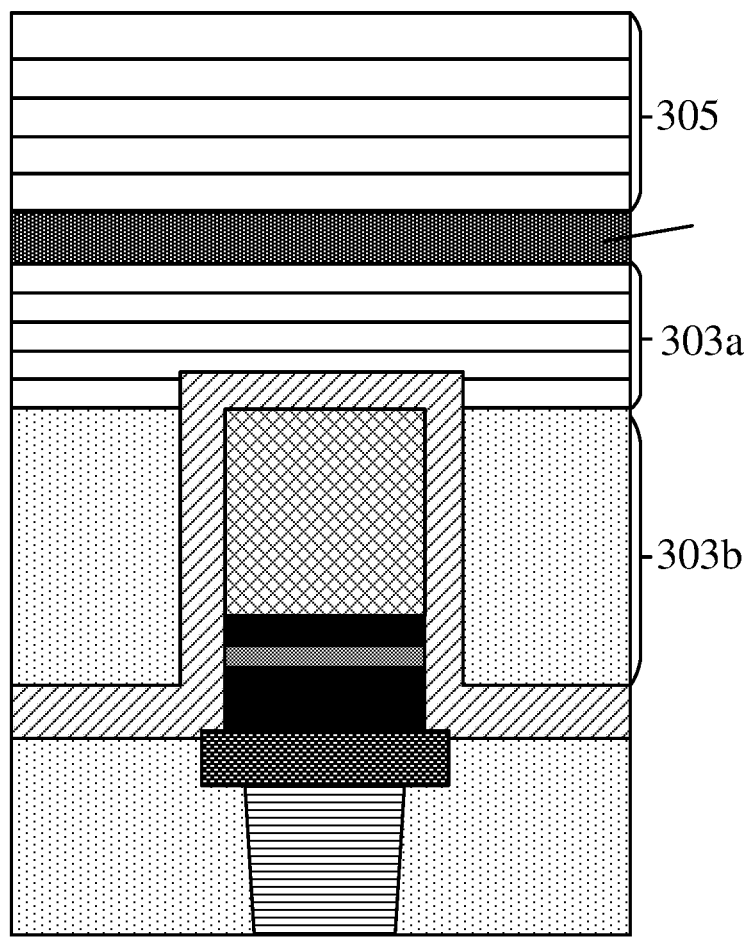
FIG. 4C is a schematic diagram of the performance gradient change of each sub-dielectric layer of a plurality of stacked sub-dielectric layers in a first dielectric layer and a second dielectric layer provided by an embodiment of the disclosure.

In practical application, as shown in FIG. 4A, for the case of forming the dielectric layer having the plurality of stacked sub-dielectric layers (more than two stacked sub-dielectric layers), such as having five stacked sub-dielectric layers, the performance, i.e., the characteristic parameter, of the dielectric layer is gradually decreased with a film thickness, i.e., a change direction of the depth of the top electrode contact hole 306, which is also shown by the arrow in FIG. 4B. FIG. 4B shows the gradient change of the performance, i.e., the characteristic parameter, shown by the arrow, of each sub-dielectric layer of a plurality of stacked sub-dielectric layers, such as five stacked sub-dielectric layers. FIG. 4C shows the case of applying FIG. 4B to the semiconductor structure of the embodiment. That is, the second dielectric layer 305 includes five stacked sub-dielectric layers, and the performance, i.e., the characteristic parameter, of each sub-dielectric layer has the gradient change. The portion 303a of the first dielectric layer surrounding the second portion 3062 of the top electrode contact hole 306 includes five stacked sub-dielectric layers, the performance, i.e., the characteristic parameter, of each sub-dielectric layer has the gradient change, and the dielectric layer having the characteristic parameter having the gradient change is not formed for the remaining portion 303b of the first dielectric layer.

In practical application, the manner for forming the plurality of stacked sub-dielectric layers includes sequentially depositing and forming each sub-dielectric layer layer by layer, where when forming the dielectric layer, the deposition parameter undergoes the gradient change over time, and more specifically, changes over the change of the sub-dielectric layer.

In one specific embodiment, a material for forming the first dielectric layer 303/the second dielectric layer 305 includes silicon oxynitride; the characteristic parameter includes the proportion of the chemical component; and the ratio of oxygen to nitrogen of the first dielectric layer 303/the second dielectric layer 305 is gradually decreased along a direction of the increasing of the depth of the top electrode contact hole.

In practical application, silicon oxynitride can be formed through Plasma Enhanced Chemical Vapor Deposition (PECVD), and a specific reaction process can include:

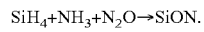

$SiH_4 + NH_3 + N_2O \rightarrow SiON$.

The ratio of oxygen to nitrogen in the formed silicon oxynitride can be adjusted by changing the proportion of the chemical component of the introduced reaction gas. That is, the ratio of oxygen to nitrogen in the silicon oxynitride can be changed by adjusting a proportion of $N_2O$ to $NH_3$, and a specifically adjusted corresponding relationship is as shown in Table 1.

TABLE 1

| $N_2O/(N_2O + NH_3)$ gas proportion | SiON stoichiometry |
|---|---|
| 90% | Si(O0.9 N0.1) |
| 60% | Si(O0.7 N0.3) |
| 32% | Si(O0.5 N0.5) |
| 10% | Si(O0.3 N0.7) |
| 4% | Si(O0.1 N0.9) |

Figure 6A:
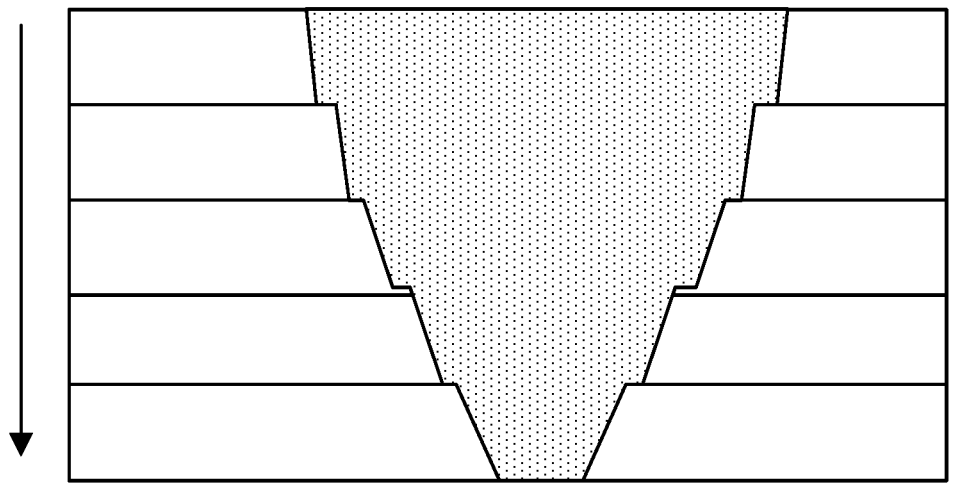
FIG. 6A is a schematic morphology diagram of a tapering sidewall of a dielectric layer having a plurality of stacked sub-dielectric layers provided by an embodiment of the disclosure.

$CF_4$ or $CHF_3$ is used as the etching gas to etch the described dielectric layer having the plurality of stacked sub-dielectric layers, so as to finally obtain the morphology of the tapering sidewall, as shown in FIG. 6A.

Figure 5A:
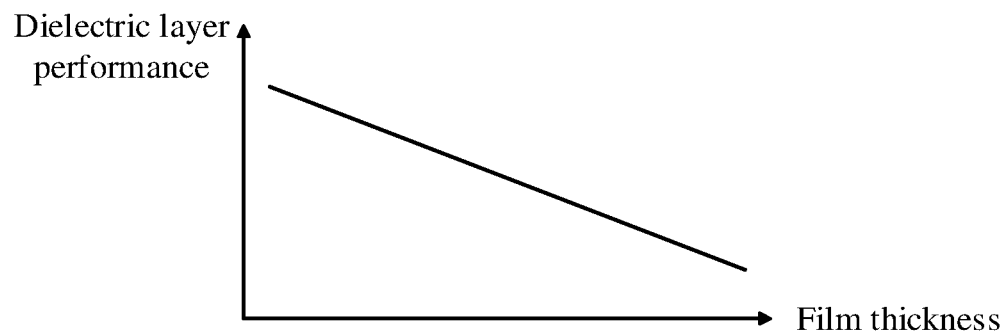
FIG. 5A is a schematic diagram of the gradual decreasing of performance of a consecutive dielectric layer with film thickness provided by an embodiment of the disclosure.
Figure 5B:
FIG. 5B is a schematic diagram of the performance gradient change of the consecutive dielectric layer provided by an embodiment of the disclosure.
Figure 5C:
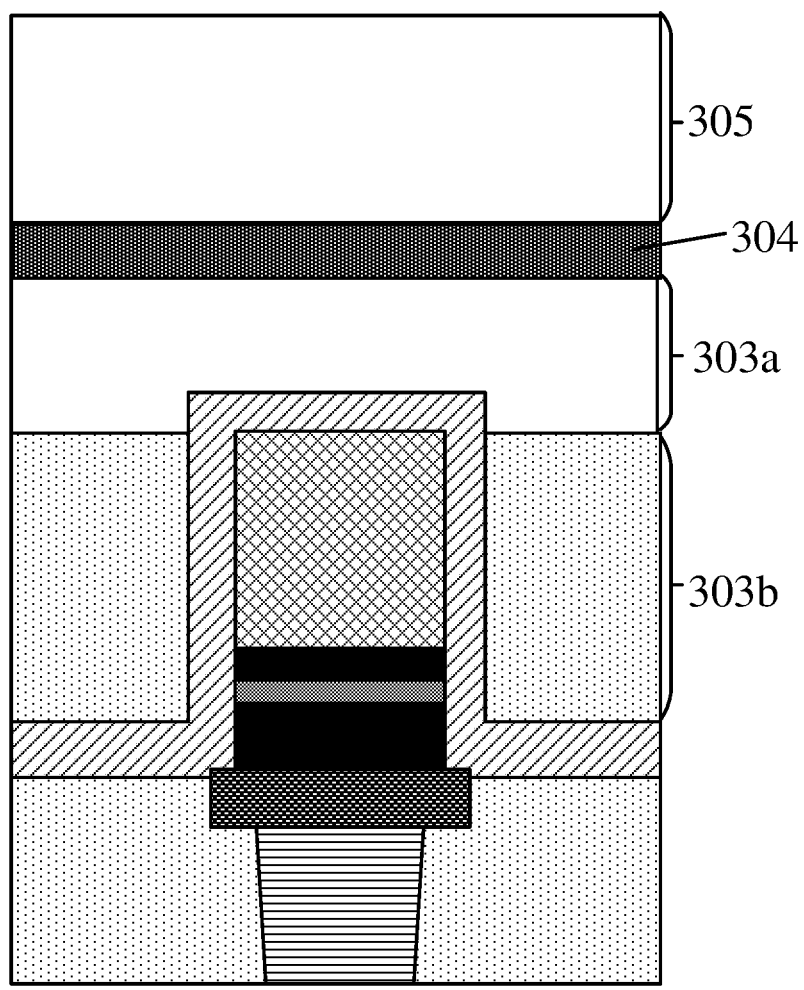
FIG. 5C is a schematic diagram of the performance gradient change of the consecutive dielectric layer in a first dielectric layer and a second dielectric layer provided by an embodiment of the disclosure.

In practical application, as shown in FIG. 5A, for the consecutive dielectric layer, the performance, i.e., the characteristic parameter, of the dielectric layer is gradually decreased with the film thickness, i.e., the change direction of the depth of the top electrode contact hole 306, which is also shown by the arrow in FIG. 5B. FIG. 5B shows the gradient change shown by the arrow of the characteristic parameter of the consecutive dielectric layer. FIG. 5C shows the case of applying FIG. 5B to the semiconductor structure of the embodiment. That is, the second dielectric layer 305 is a consecutive dielectric layer, and the characteristic parameter of the second dielectric layer has the gradient change. The portion 303*a* of the first dielectric layer surrounding the second portion 3062 of the top electrode contact hole 306 is a consecutive dielectric layer, and has the characteristic parameter having the gradient change. The dielectric layer having the characteristic parameter having the gradient change is not formed for the remaining portion 303*b* of the first dielectric layer.

In practical application, the manner for forming the consecutive dielectric layer includes forming the dielectric layer through one deposition step, where when forming the dielectric layer, the deposition parameter undergoes the gradient change over time.

Figure 6B:
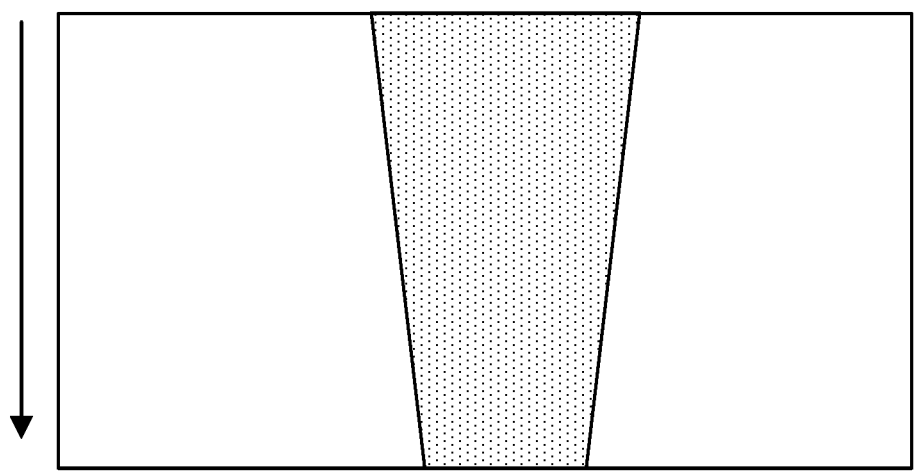
FIG. 6B is a schematic morphology diagram of a tapering sidewall of a consecutive dielectric layer provided by an embodiment of the disclosure.

The described consecutive dielectric layer is etched to finally obtain the morphology of the tapering sidewall, as shown in FIG. 6B.

Second Manner:

In the case of forming the corresponding dielectric layer to be etched (broadly referring to the first dielectric layer or the second dielectric layer), a conventional deposition condition is used to perform deposition (i.e., a certain deposition parameter is not intentionally set to have a gradient change over time). When etching the dielectric layer to be etched, the etching parameter having the gradient change over time is used. In this case, the etching rate or the etch selectivity ratio would have the gradient change along the depth direction of the top electrode contact hole. It can be understood that by means of reasonable control, the etching rate or the etch selectivity ratio can be gradually decreased along the depth direction of the top electrode contact hole, so that the dimension of the opening along the depth direction of the top electrode contact hole is gradually decreased.

Herein, the etch selectivity ratio of the first dielectric layer has the gradient change along the depth direction of the top electrode contact hole, and the etching parameter at least includes at least one of a proportion of a chemical component of an etching gas, temperature, pressure, or radio frequency power, or is another etching parameter capable of changing the etching rate or the etch selectivity ratio.

Third Manner:

The first manner and the second manner are simultaneously implemented. It can be understood that the third manner can make the tapering sidewall to be more steep.

Herein, the second portion 3062 having the tapering sidewall and the first portion 3061 having a selectively tapering sidewall are formed.

In practical application, in a subsequent manufacturing process, it is needed to form the top electrode contact plug in the top electrode contact hole.

Figure 2H:
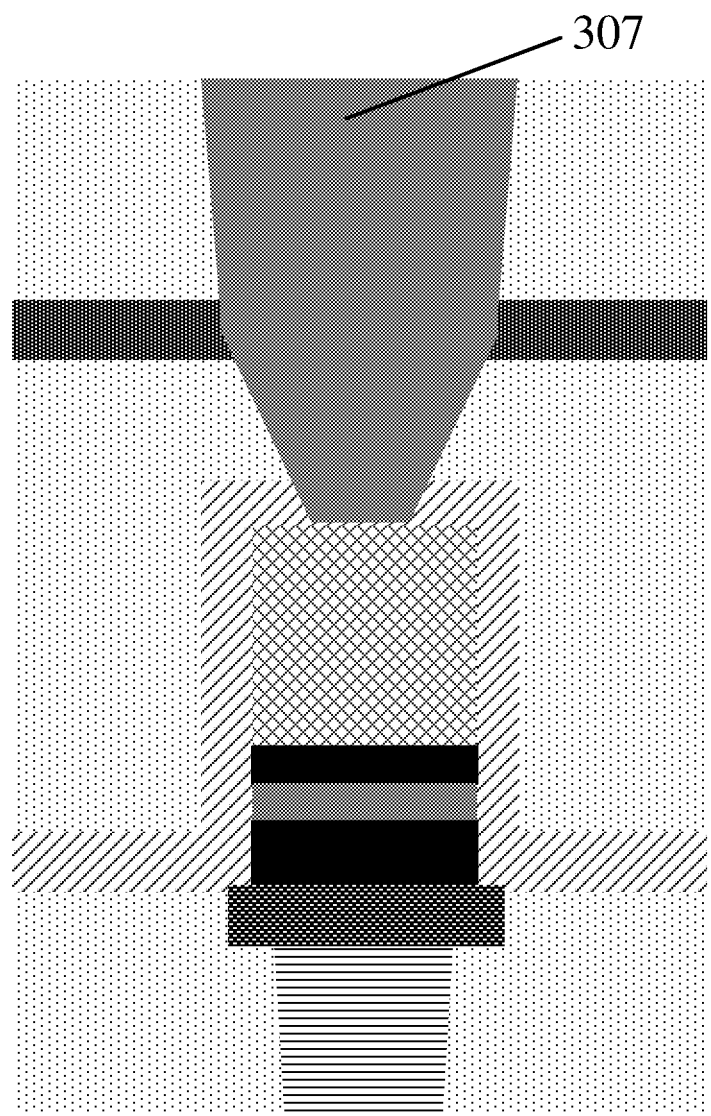

In some embodiments, the method further includes: filling the top electrode contact hole 306 with a conductive material 307' (as shown in FIG. 2G); and performing a planarization processing on the conductive material 307' to form the top electrode contact plug 307 (as shown in FIG. 2H).

In practical application, a manner for filling the conductive material 307' includes, but is not limited to, the CVD, PVD, or ALD process. A manner for performing a planarization processing on the conductive material 307' includes, but is not limited to, CMP.

The embodiments of the disclosure relate to the manufacturing of the semiconductor structure including the MRAM cell, and in particular to a solution of a landing process and an integration for the top electrode contact hole. Etching control is performed on the top electrode contact hole by using the etch stop layer, and then the top electrode contact hole is landed on the MTJ post by a tapered etching technique. It can be understood that the solution of the embodiments of the disclosure is applicable to a high-density MRAM having a small MTJ bit unit.

In the embodiments of the disclosure, a tapered morphology is formed by controlling the gradient change of the etching rate or the etching selectivity during the etching of the dielectric layer, thereby being capable of achieving the top electrode contact hole with the radial width of a top portion being greater than the radial width of the top electrode, and further improving the dimensional tolerance of the top electrode contact hole. Moreover, the reduction of a dimension of a bottom portion of the top electrode contact hole can avoid damaging the packaging of the sidewall of the MTJ, thereby reducing a risk that the MTJ has poor performance or metal pollution. In addition, the method for manufacturing the semiconductor structure including the MRAM cell provided by the embodiments of the disclosure does not need a complex MTJ planarization step.

According to the described manufacturing method, the embodiments of the disclosure further provide a semiconductor structure. The semiconductor structure includes: an MRAM cell, including a bottom electrode, an MTJ stack, and a top electrode; an insulating layer covering a sidewall partially and a top surface of the MRAM cell; a first dielectric layer, a stop layer, and a second dielectric layer sequentially stacked on the insulating layer; and a top electrode contact hole penetrating through the second dielectric layer, the stop layer, the first dielectric layer, and the insulating layer, and extending to the top electrode. The top electrode contact hole includes a first portion and a second portion connected with each other in the stop layer, and a radial width of the second portion in contact with the top electrode is gradually decreased with an increase in a depth of the top electrode contact hole.

In some embodiments, a radial width of the first portion is greater than a radial width of the top electrode.

In some embodiments, a characteristic parameter of the first dielectric layer has a gradient change along a depth direction of the top electrode contact hole.

In some embodiments, the first dielectric layer includes a consecutive dielectric layer, and a characteristic parameter of the consecutive dielectric layer has a gradient change along the depth direction of the top electrode contact hole; or, the first dielectric layer includes a plurality of stacked sub-dielectric layers, and a characteristic parameter of the plurality of stacked sub-dielectric layers has a gradient change along the depth direction of the top electrode contact hole.

In some embodiments, the characteristic parameter at least includes at least one of stress; rigidity; or a proportion of a chemical component.

In some embodiments, a material for forming the first dielectric layer includes silicon oxynitride; the characteristic parameter includes the proportion of the chemical component; and a ratio of nitrogen to oxygen of the first dielectric layer is gradually increased along a direction of the increasing of the depth of the top electrode contact hole.

In some embodiments, the radial width of the first portion is gradually decreased with the increase in the depth of the top electrode contact hole; or, the radial width of the first portion remains unchanged with the increase in the depth of the top electrode contact hole.

In some embodiments, the radial width of the first portion is gradually decreased with the increase in the depth of the top electrode contact hole; and a characteristic parameter of the second dielectric layer has a gradient change along the depth direction of the top electrode contact hole.

In some embodiments, a material for forming the stop layer includes silicon nitride, silicon oxide, silicon carbide, or silicon oxynitride.

In some embodiments, the material for forming the stop layer is the same as the material forming the first dielectric layer.

In some embodiments, the semiconductor structure further includes a top electrode contact plug located in the top electrode contact hole, and a material for forming the top electrode contact plug includes a conductive material.

The embodiments of the disclosure further provide a semiconductor memory, including the semiconductor structure provided by the embodiments of the disclosure.

The embodiments of the disclosure relate to performing first etching control on the top electrode contact hole by the etching stop layer, and then in the etching of a rear portion of the top electrode contact hole, performing second etching control on the top electrode contact hole by using a tapered etching technique. Through the foregoing two-time control, controllability is apparently improved when the top electrode contact hole is landed at the MTJ stack of the MRAM cell. In this way, the problems of the performance degradation and metal pollution of the MTJ caused by over-etching when the top electrode contact hole is landed can be avoided.

It should be understood that "one embodiment" or "an embodiment" mentioned in the whole description means that particular features, structures, or characteristics related to the embodiments are included in at least one embodiment of the disclosure. Therefore, "in one embodiment" or "in an embodiment" appearing in the whole description does not necessarily refer to a same embodiment. In addition, these particular features, structures, or characteristics may be combined in one or more embodiments in any appropriate manner. It should be understood that sequence numbers of the foregoing processes do not mean execution sequence in various embodiments of the disclosure, and the execution sequence of the various processes should be determined based on their function and internal logic, and should not construct any limitation on the implementation process of the embodiments of the disclosure. The foregoing sequence numbers of the embodiments of the disclosure are only for description, but do not represent superiority-inferiority of the embodiments.

The methods disclosed in the method embodiments provided by the disclosure can be arbitrarily combined without causing conflicts so as to obtain a new method embodiment.

The descriptions above only involve specific implementations of the embodiments of the disclosure. However, the scope of protection of the embodiments of the disclosure is not limited thereto. Within the technical scope disclosed by the embodiments of the disclosure, any variation or substitution that can be easily conceived by a person of ordinary skill in the art should all be included within the scope of protection of the embodiments of the disclosure. Therefore, the scope of protection of the embodiments of the disclosure should be determined by the scope of protection of the claims.

The invention claimed is:

1. A method for manufacturing a semiconductor structure, comprising:

providing a Magnetic Random Access Memory (MRAM) cell and an insulating layer, wherein the MRAM cell comprises a bottom electrode, a Magnetic Tunnel Junction (MTJ) stack, and a top electrode, and the insulating layer covers a top surface and a sidewall of the MRAM cell;

sequentially forming and stacking a first dielectric layer, a stop layer, and a second dielectric layer on the insulating layer;

performing a first etching on the second dielectric layer to form a first portion of a top electrode contact hole penetrating through the second dielectric layer and extending to the stop layer; and performing a second etching on the first dielectric layer and the insulating layer to form a second portion of the top electrode contact hole penetrating through the first dielectric layer and the insulating layer, extending to the top electrode, and deepening the first portion, wherein a radial width of the second portion is gradually decreased with an increase in a depth of the top electrode contact hole;

wherein said forming the first dielectric layer or the second dielectric layer comprises: forming, by using a deposition parameter having a gradient change over time, the first dielectric layer or the second dielectric layer with a characteristic parameter having a gradient change along a depth direction of the top electrode contact hole; or said performing the second etching on the first dielectric layer and the insulating layer comprises: performing the second etching on the first dielectric layer and the insulating layer by using an etching parameter having a gradient change over time.

2. The method of claim 1, wherein a radial width of the first portion is greater than a radial width of the top electrode.

3. The method of claim 1, wherein said forming the first dielectric layer or the second dielectric layer comprises: forming, by using a deposition parameter having a gradient change over time, the first dielectric layer or the second dielectric layer with a characteristic parameter having a gradient change along a depth direction of the top electrode contact hole; and said performing the second etching on the first dielectric layer and the insulating layer comprises: performing the second etching on the first dielectric layer and the insulating layer by using an etching parameter having a gradient change over time.

4. The method of claim 1, wherein a radial width of the first portion is gradually decreased with the increase in the depth of the top electrode contact hole; and said performing the first etching on the second dielectric layer comprises: performing the first etching on the second dielectric layer by using an etching parameter having a gradient change over time.

5. The method of claim 3, wherein said forming the first dielectric layer or the second dielectric layer comprises:
   forming a first consecutive dielectric layer or a second consecutive dielectric layer, wherein a characteristic parameter of the first consecutive dielectric layer or the second consecutive dielectric layer has a gradient change along the depth direction of the top electrode contact hole;
   or,
   forming the first dielectric layer or the second dielectric layer having a plurality of stacked sub-dielectric layers, wherein a characteristic parameter of the plurality of stacked sub-dielectric layers has a gradient change along the depth direction of the top electrode contact hole.

6. The method of claim 3, wherein the deposition parameter at comprises at least one of:
   a proportion of a chemical component of a reaction gas;
   pressure;
   temperature; or
   power.

7. The method of claim 3, wherein the characteristic parameter comprises at least one of
   a proportion of a chemical component of the first dielectric layer or the second dielectric layer;
   stress; or
   rigidity.

8. The method of claim 3, wherein an etch selectivity ratio of the first dielectric layer has a gradient change along the depth direction of the top electrode contact hole, and the etching parameter comprises at least one of:
   a proportion of a chemical component of an etching gas;
   temperature;
   pressure; or
   power.

9. The method of claim 1, further comprising:
   filling the top electrode contact hole with a conductive material; and
   performing a planarization processing on the conductive material to form a top electrode contact plug.

* * * * *